US009000776B1

(12) United States Patent
Tam et al.

(10) Patent No.: US 9,000,776 B1
(45) Date of Patent: Apr. 7, 2015

(54) STRUCTURE CHARACTERISTIC IMPEDANCE ESTIMATOR USING CURRENT PROBE

(75) Inventors: Daniel W. Tam, San Diego, CA (US); Randall A. Reeves, San Diego, CA (US); John H. Meloling, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 962 days.

(21) Appl. No.: 12/964,517

(22) Filed: Dec. 9, 2010

(51) Int. Cl.
*G01R 27/04* (2006.01)
*G01R 27/32* (2006.01)
*G06F 17/50* (2006.01)

(52) U.S. Cl.
CPC .................................. *G06F 17/5036* (2013.01)

(58) Field of Classification Search
CPC .. G01R 35/005; G01R 27/06; G01R 29/0878; G06F 17/5036
USPC ........... 324/638, 95, 324, 531, 601, 603, 623; 343/714; 702/65, 107
See application file for complete search history.

(56) References Cited

U.S. PATENT DOCUMENTS

| | | | | |
|---|---|---|---|---|
| 3,990,003 | A * | 11/1976 | Agee et al. ..................... | 324/531 |
| 5,378,992 | A | 1/1995 | Murphy | |
| 5,633,648 | A * | 5/1997 | Fischer .......................... | 343/788 |
| 5,793,214 | A * | 8/1998 | Wakamatsu ................... | 324/601 |
| 6,492,956 | B1 * | 12/2002 | Fischer et al. ................. | 343/788 |
| 6,577,155 | B2 * | 6/2003 | Stewart et al. ................. | 326/32 |
| 6,861,846 | B2 * | 3/2005 | Anderson ...................... | 324/623 |
| 7,061,254 | B1 * | 6/2006 | Shoulders et al. ............ | 324/601 |
| 7,898,484 | B1 * | 3/2011 | Tam ............................... | 343/701 |
| 8,111,205 | B1 * | 2/2012 | Tam et al. ...................... | 343/788 |
| 8,311,752 | B1 * | 11/2012 | Tam et al. ....................... | 702/57 |

(Continued)

OTHER PUBLICATIONS

Marks, Roger B. et al.; Characteristic Impedance Determination Using Propagation Constant Measurement; IEEE Microwave and Guided Wave Letters, vol. 1, No. 6, Jun. 1991.

(Continued)

*Primary Examiner* — Tung X Nguyen
*Assistant Examiner* — Giovanni Astacio-Oquendo
(74) *Attorney, Agent, or Firm* — SPAWAR Systems Center Pacific; Kyle Eppele; J. Eric Anderson

(57) ABSTRACT

A method for estimating the characteristic impedance of a structure comprising the following steps: providing a current probe comprising a magnetic core having an aperture therein and a primary winding wrapped around the core; measuring, with a calibrated vector network analyzer (VNA), the impedance ($Z_{op}$) of the current probe while in an open configuration wherein nothing but air occupies the aperture and the current probe is isolated from a ground; measuring, with the VNA, the impedance ($Z_{sh}$) of the current probe while in a short configuration, wherein the current probe is electrically shorted; measuring, with the VNA, the impedance ($Z_{in}$) of the current probe while the current probe is mounted to the structure such that the structure extends through the aperture; and calculating an estimated characteristic impedance ($Z'_{mast}$) of the structure according to the following equation: $Z'_{mast} = (Z_{in}-Z_{sh})(Z_{op}-Z_{sh})/(Z_{op}-Z_{in})$.

17 Claims, 10 Drawing Sheets

(56) References Cited

U.S. PATENT DOCUMENTS

| | | | |
|---|---|---|---|
| 2003/0025487 A1* | 2/2003 | Jian et al. | 324/95 |
| 2003/0171886 A1* | 9/2003 | Hill et al. | 702/91 |
| 2004/0217762 A1* | 11/2004 | Gifford | 324/324 |
| 2005/0093554 A1* | 5/2005 | Wang et al. | 324/638 |
| 2005/0194981 A1* | 9/2005 | Cole | 324/638 |
| 2008/0048677 A1* | 2/2008 | Tan et al. | 324/638 |
| 2010/0176817 A1* | 7/2010 | McLean et al. | 324/603 |
| 2011/0231123 A1* | 9/2011 | Bacon et al. | 702/63 |
| 2011/0238383 A1* | 9/2011 | Metzger | 702/196 |

OTHER PUBLICATIONS

Meloling, John H. et al.; A Transmit Mast-Clamp Current Probe for Shipboard HF Communications: IEEE 0/7803-8883-6/05; 2005.

Southwick, Roger A.; Line Impedance Measuring Instrumentation Utilizing Current Probe Coupling; IEEE Transactions on Electromagnetic Compatibility; Nov. 1971.

* cited by examiner

Open Configuration

$$Z'_{mast} = \frac{(Z_{in} - Z_{sh})(Z_{op} - Z_{sh})}{(Z_{op} - Z_{in})}$$

ABSTRACT

STRUCTURE CHARACTERISTIC IMPEDANCE ESTIMATOR USING CURRENT PROBE

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil. Reference Navy Case Number 100476.

BACKGROUND OF THE INVENTION

When a specially-designed current probe is clamped to a conductive structure, such as a ship's mast, the combination of the current probe and mast can function as an antenna (hereinafter referred to as a mast clamp current probe (MCCP) antenna). Current probes used in MCCP antenna applications must be specifically designed for the platform on which the current probe will be used. In order to properly match the current probe to the structure, the current probe designer needs to know the characteristic impedance of the structure. The "characteristic impedance" is the impedance of the structure that the probe will see. Previously the characteristic impedance of the structure was determined by feeding a brass, scale model of the structure as if it were an antenna.

SUMMARY

Disclosed herein is a method for estimating the characteristic impedance of a structure comprising the following steps: providing a current probe comprising a magnetic core having an aperture therein and a primary winding wrapped around the core; measuring, with a calibrated vector network analyzer (VNA), the impedance ($Z_{op}$) of the current probe while in an open configuration wherein nothing but air occupies the aperture and the current probe is isolated from a ground; measuring, with the VNA, the impedance ($Z_{sh}$) of the current probe while in a short configuration, wherein the current probe is electrically shorted; measuring, with the VNA, the impedance ($Z_{in}$) of the current probe while the current probe is mounted to the structure such that the structure extends through the aperture; and calculating an estimated characteristic impedance ($Z'_{mast}$) of the structure according to the following equation: $Z'_{mast} = (Z_{in} - Z_{sh})(Z_{op} - Z_{sh})/(Z_{op} - Z_{in})$.

BRIEF DESCRIPTION OF THE DRAWINGS

Throughout the several views, like elements are referenced using like references. The elements in the figures are not drawn to scale and some dimensions are exaggerated for clarity.

FIG. 9b is an illustration of a Smith chart showing the resulting cascade impedance for the scenario depicted in FIG. 9a.

FIG. 9c is an illustration of a Smith chart showing the resulting characteristic impedance of the truck tail pipe depicted in FIG. 9a.

DETAILED DESCRIPTION OF EMBODIMENTS

Figure 1:
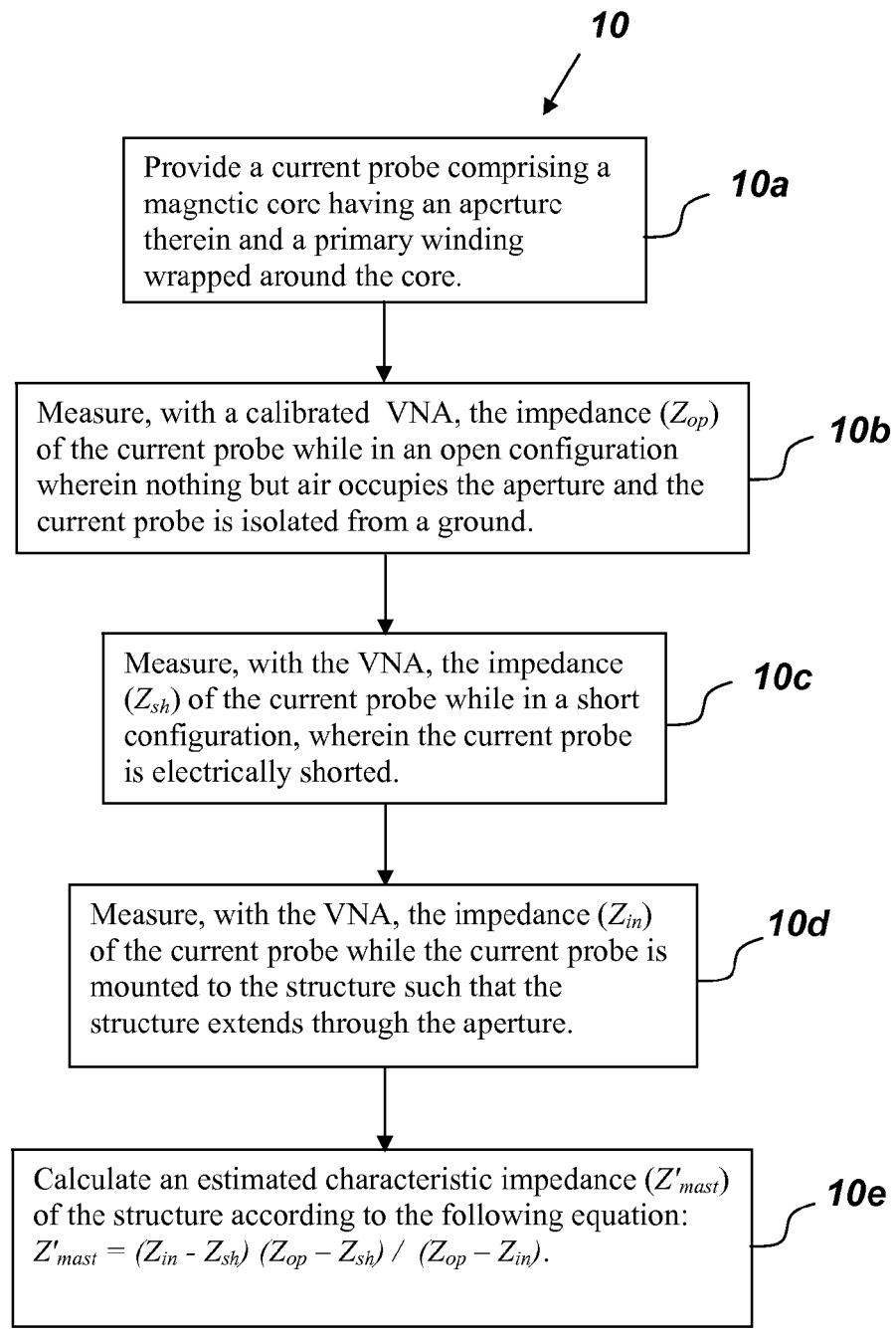
FIG. 1 is a flow chart of a method for estimating the characteristic impedance of a structure.
Figure 2A:
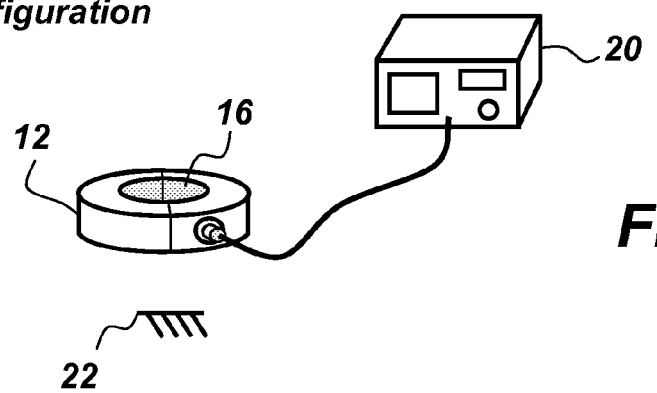
FIG. 2a is an illustration of a current probe and a vector network analyzer in an open configuration.
Figure 3A:
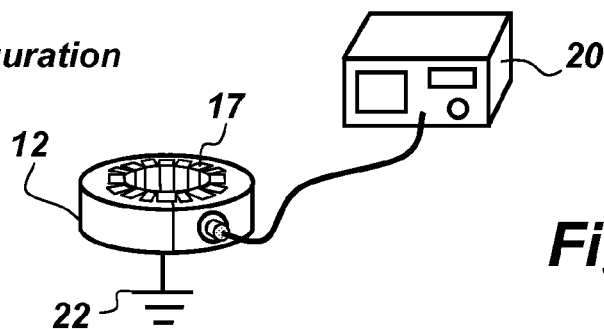
FIG. 3a is an illustration of a current probe and a vector network analyzer in a short configuration.

FIG. 1 is a flowchart of a method 10 for estimating the characteristic impedance of a conductive structure 11 by using a current probe 12, without having to build a scale model of the structure. The elements and configurations mentioned in method 10 are described below and depicted in FIGS. 2a, 3a, and 4a. In a mast clamp current probe (MCCP) antenna, the impedance that the current probe 12 will "see" varies depending on where the current probe 12 is mounted on the structure 11. Different locations on the structure 11 have different impedance properties. The impedance estimation method 10 may be used to identify the best locations on structure 11 to place the current probe 12 to provide desired antenna performance.

Figure 2B:
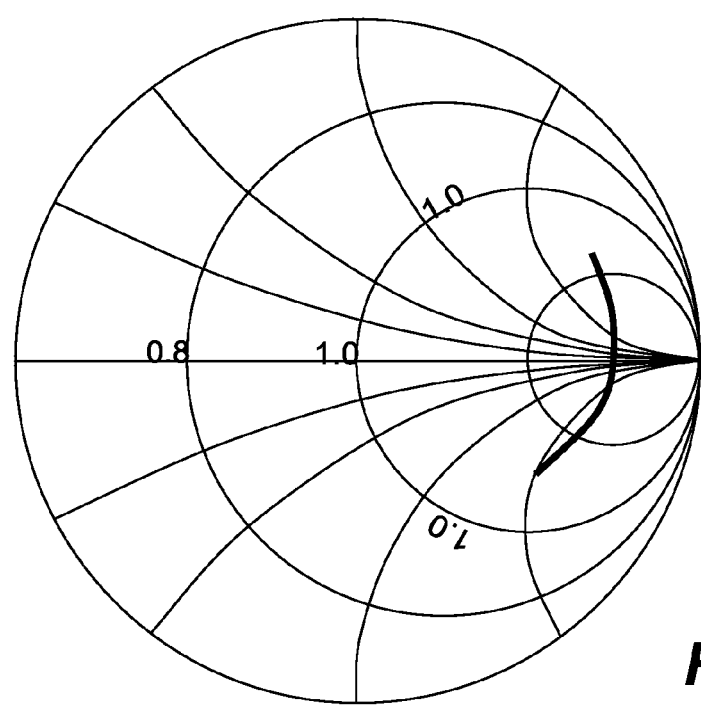
FIG. 2b is an example of a Smith chart showing open-configuration measurement results.
Figure 3B:
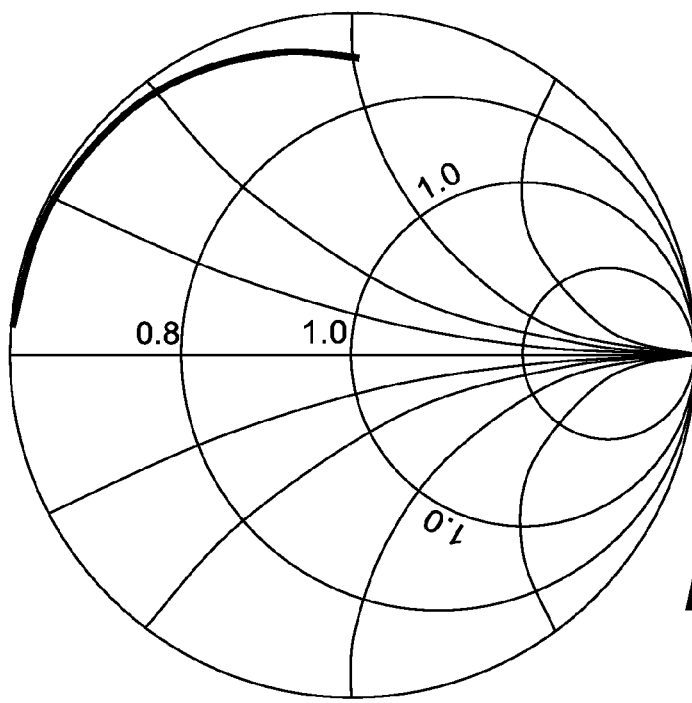
FIG. 3b is an example of a Smith chart showing short-configuration measurement results.
Figure 4A:
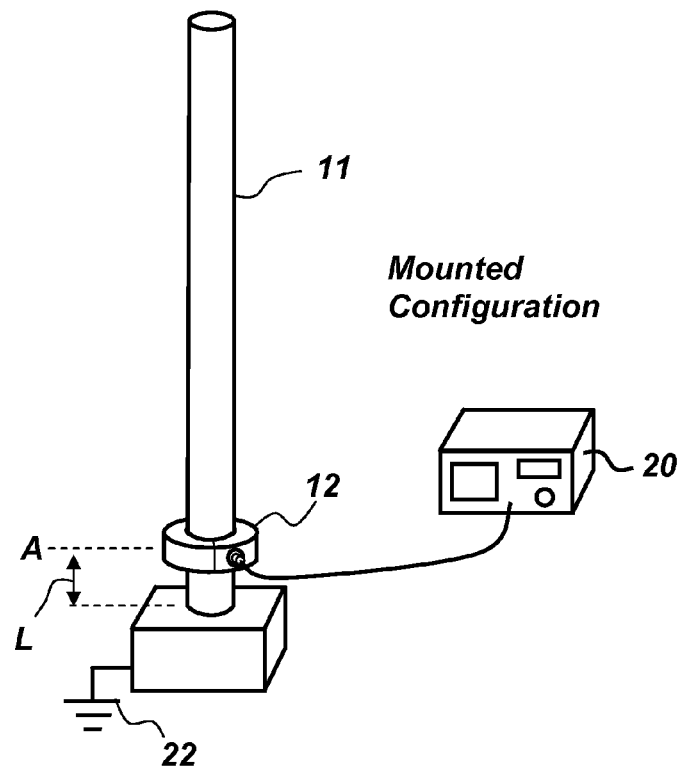
FIG. 4a is an illustration of a current probe, a structure and a vector network analyzer in a mounted configuration.
Figure 4B:
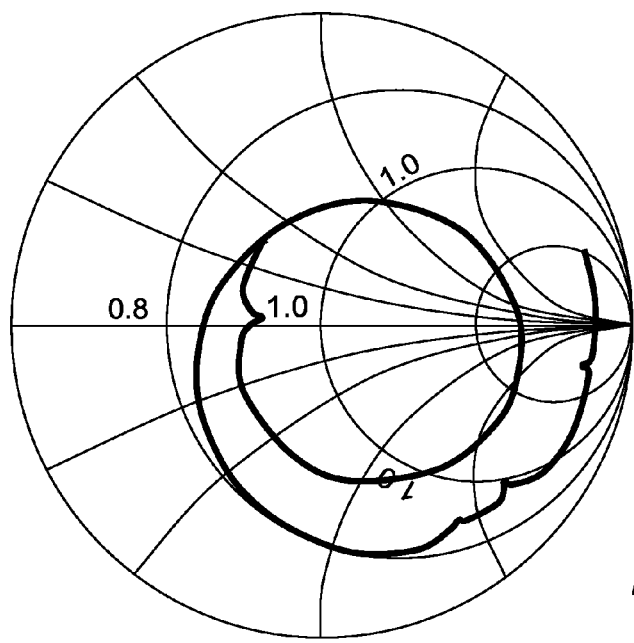
FIG. 4b is an example of a Smith chart showing mounted-configuration measurement results.
Figure 6A:
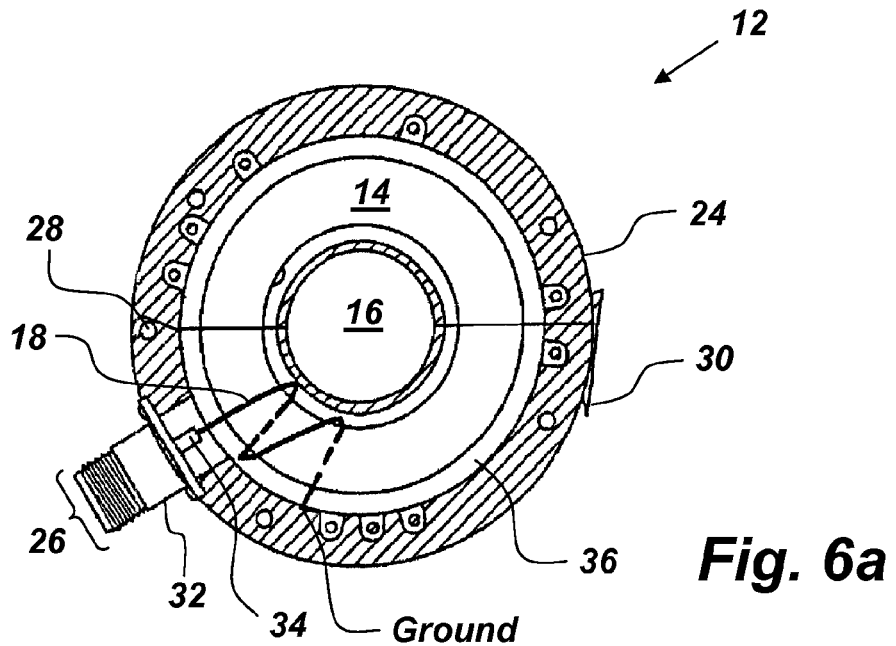
FIG. 6a is a cross-sectional view of a one embodiment of a current probe.

Step 10a of the impedance estimation method 10 calls for providing the current probe 12. As shown in FIG. 6a and described below, the current probe 12 comprises a magnetic core 14 having an aperture 16 therein and a primary winding 18 wrapped around the core 14. Step 10b provides for measuring, with a calibrated vector network analyzer (VNA) 20, the impedance ($Z_{op}$) of the current probe 12 while in an open configuration. The VNA 20 may be any vector network analyzer or performance network analyzer (PNA). For example, a suitable VNA 20 is a model 8753ES, 2-port VNA made by Agilent Technologies. In the open configuration, depicted in FIG. 2a, nothing but air occupies the aperture 16 and the current probe 12 is isolated from a ground source 22. FIG. 2b shows an example Smith chart of the measurement conducted in step 10b. In step 10c the impedance ($Z_{sh}$) of the current probe 12 is measured with the VNA 20 while in a short configuration. In the short configuration, depicted in FIG. 3a, the current probe 12 is electrically shorted. FIG. 3b shows an example Smith chart of the measurement conducted in step 10c. In the embodiment shown in FIG. 3a, the current probe 12 is shorted by covering the inner walls of the aperture 16 with a conductive tape 17. Any conductive tape can be used as the conductive tape 17. A suitable, non-limiting example the conductive tape 17 is copper tape. The current probe 12 may also be shorted by clamping the current probe 12 around a shorted measurement fixture or by wrapping a metallic wire around a conductive housing 24 (shown in FIG. 6a) in a closed-loop configuration. Step 10d provides for measuring, with the VNA 20, the impedance ($Z_{in}$) of the current probe 12 while the current probe 12 is mounted to the structure 11 at a location A. FIG. 4*a* depicts an example of a mounted configuration that may be used in step 10*d*. In the mounted configuration the current probe 12 is mounted to the structure 11 such that the structure 11 extends through the aperture 16. In the embodiment shown in FIG. 4*a*, the current probe 12 is mounted to the structure 11 at location A, which is positioned a distance L from the base of the structure 11. It is to be understood that the distance L can be any desired distance. FIG. 4*b* shows an example Smith chart of the measurement conducted in step 10*d*. Step 10*e* provides for calculating an estimated characteristic impedance ($Z'_{mast}$) of the structure 11 at location A according to the following equation: $Z'_{mast} = (Z_{in} - Z_{sh})(Z_{op} - Z_{sh})/(Z_{op} - Z_{in})$.

Figure 5:
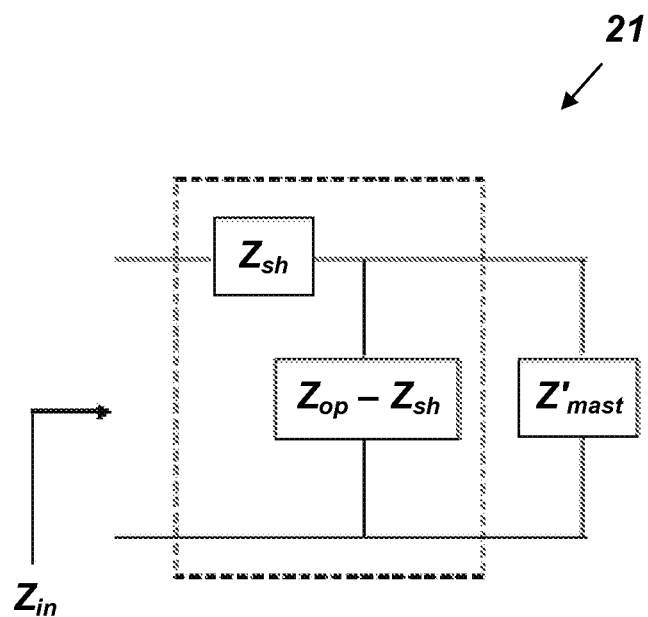
FIG. 5 is a simplified Thevenin equivalent circuit model for a MCCP antenna.

FIG. 5 shows a simplified Thevenin equivalent circuit model 21 for an MCCP antenna. The circuit model 21 illustrates how the equation utilized in step 10*e* above was derived. The completion of steps 10*a*-10*c* of the impedance estimation method 10 with a given current probe 12 results in the characterization of that particular current probe 12. A given current probe 12 need only be characterized once and then that current probe 12 can be used to estimate the characteristic impedance of different structures 11 and different locations on a single structure 11 without having to repeat steps 10*a*-10*c*. By comparing calculated $Z'_{mast}$ values from multiple locations on the structure 11, one can identify a location on the structure 11 that has substantially optimal impedance for radio frequency resonance.

Figure 6B:
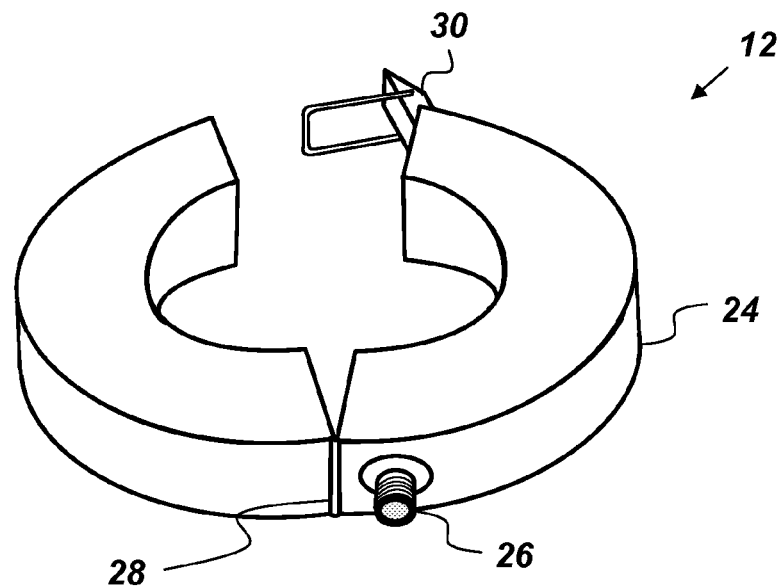
FIG. 6b is a perspective view of one embodiment of a current probe.

FIG. 6*a* shows a horizontal cross-sectional view of a current probe 12 exposing the relationship of the magnetic core 14 and its primary winding 18. The current probe 12 may also comprise a housing 24 and a feed connector 26. FIGS. 6*a* and 6*b* show the features that allow the shown embodiment of the current probe 12 to be clamped around the structure 11. A hinge 28 allows the depicted embodiment of the current probe 12 to be hinged open and positioned around the conductive structure 11. In this embodiment, a releasable latch 30 allows the two core halves to be latched together.

Also shown in the embodiment of the current probe 12 depicted in FIG. 6*a*, the magnetic core 14 and primary winding 18 are contained within the housing 24. The magnetic core 14 may be comprised of any suitable magnetic material with a high resistivity. The primary winding 18 may be wound around the magnetic core 14 for any number of desired turns. The number of turns of the primary winding 18 and the magnetic core 14 materials will provide different inductive and resistive characteristics, affecting the frequency response and thus the insertion loss of the current probe 12. The primary winding 18 may consist of a single turn around the magnetic core 14 or several turns around the magnetic core 14. The primary winding 18 may cover only one half of the magnetic core 14, or may extend around both core halves. The primary winding 18 may be terminated with a connection to the housing 24 as a ground, or it can be terminated in a balanced to unbalanced transformer (typically referred to as a BALUN). A radio frequency (RF) signal may be coupled into the current probe 12 through the feed connector 26. Examples of the feed connectors 26 include, but are not limited to: BNC (bayonet Neill-Concelman), SMA (SubMiniature version A), TNC (threaded Neill-Concelman), and N-style coaxial connectors. If a coaxial connector is used, the shield 32 portion of the connector 26 may be coupled to the housing 24, while the inside conductor 34 of the connector 26 is coupled to the primary winding 18. The primary winding 18 and magnetic core 14 may be insulated from the housing 24 by an electrical insulating layer 36. The insulating layer 36 may comprise any suitable electrical insulating materials. The core halves of the magnetic core 14 are generally in contact with each other when the current probe 12 is closed. Although FIGS. 6*a* and 6*b* show the current probe 12 as configured to clamp around the conductive structure 11, it is to be understood that the manner of mounting the current probe 12 to the conductive structure 11 is not limited to clamping, but any effective manner of mounting the current probe 12 to the conductive structure 11 may be used. The current probe 12 may be any desired size and shape.

Figure 7A:
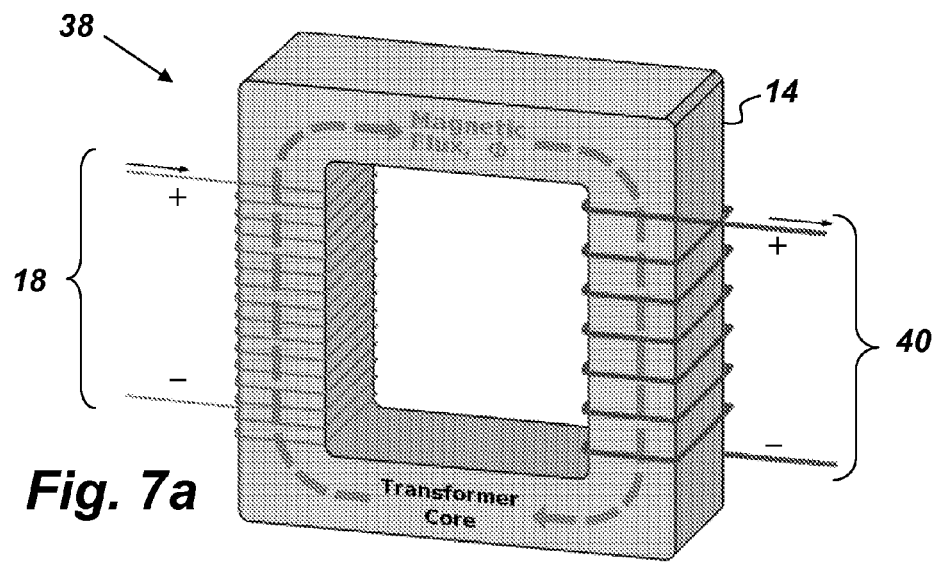
FIGS. 7a-7b are graphic illustrations comparing a traditional transformer to a MCCP antenna.
Figure 7B:
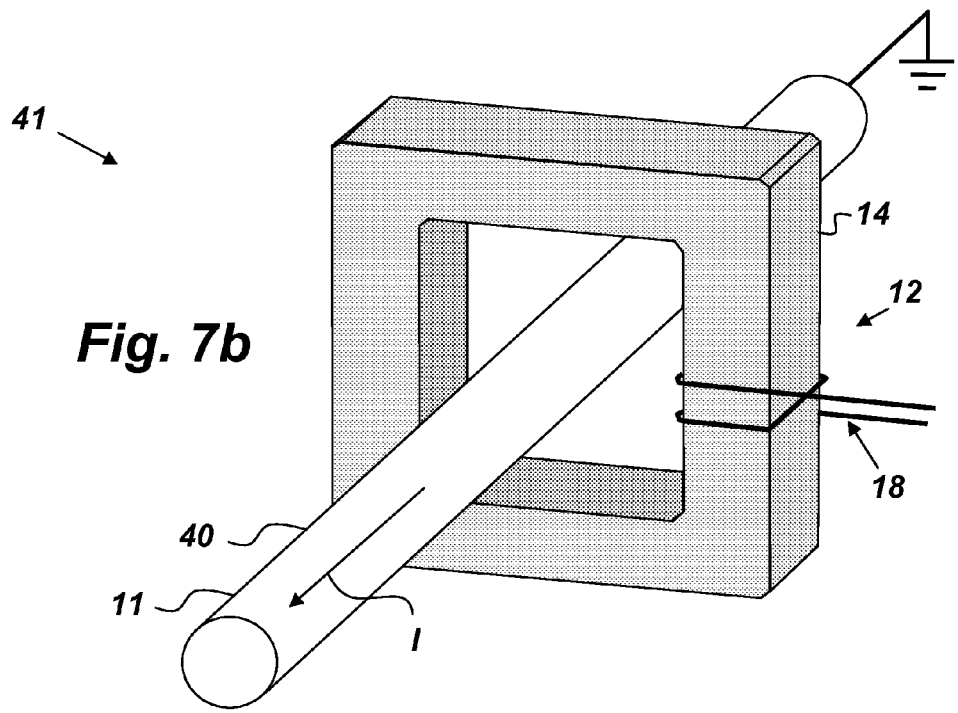

FIG. 7*a* is an illustration of a basic transformer 38. An MCCP antenna can be compared to the basic transformer 38. The transformer 38 comprises a primary winding 18, a secondary winding 40, and a magnetic core 14. The transformer 38 works on Faraday's law of induction principle of sharing common magnetic flux in the magnetic core 14 to transfer the electric energy from one winding to the other. FIG. 7*b* shows the similarities between a transformer 38 and a simple depiction of an MCCP antenna 41. Like the transformer 38, the current probe 12 also has a magnetic core 14 and a primary winding 18. The electromagnetism principle of the MCCP antenna is that a varying magnetic field generated in the magnetic core 14 induces a current I into the conductive structure 11, which forms a secondary winding 40. The primary winding 18 of the current probe 12 comprises a coil of wire wrapped around the magnetic core 14. The conductive structure 11 may be any type of conductive structure that a portion of which will fit inside the aperture 16 of the current probe 12. The structure 11 may be closed loop or open-ended. For example, in the embodiment depicted in FIG. 7*b*, the structure 11 has a grounded end and an open end.

Faraday's law of induction helps explain the functioning of an MCCP antenna. Faraday's law of induction formalized the interrelationship between electromotive force (EMF) or "voltage" and magnetic flux in the following equation:

$$|E| = \left| \frac{\partial \Phi_B}{\partial t} \right|$$

where
E=EMF in volts
$\Phi_B$=magnetic flux in webers

The MCCP antenna is an electromagnetic energy transducer much like the transformer 38. In both cases, electrical energy fed into the primary winding 18 is magnetically coupled into the magnetic core 14, which in turns couples the energy into the secondary winding 40. In the case of the transformer 38, the secondary winding 40 delivers this energy to a load. But in the case of the MCCP antenna, the conductive structure 11 (i.e. the secondary winding) radiates this energy into space.

Figure 8:
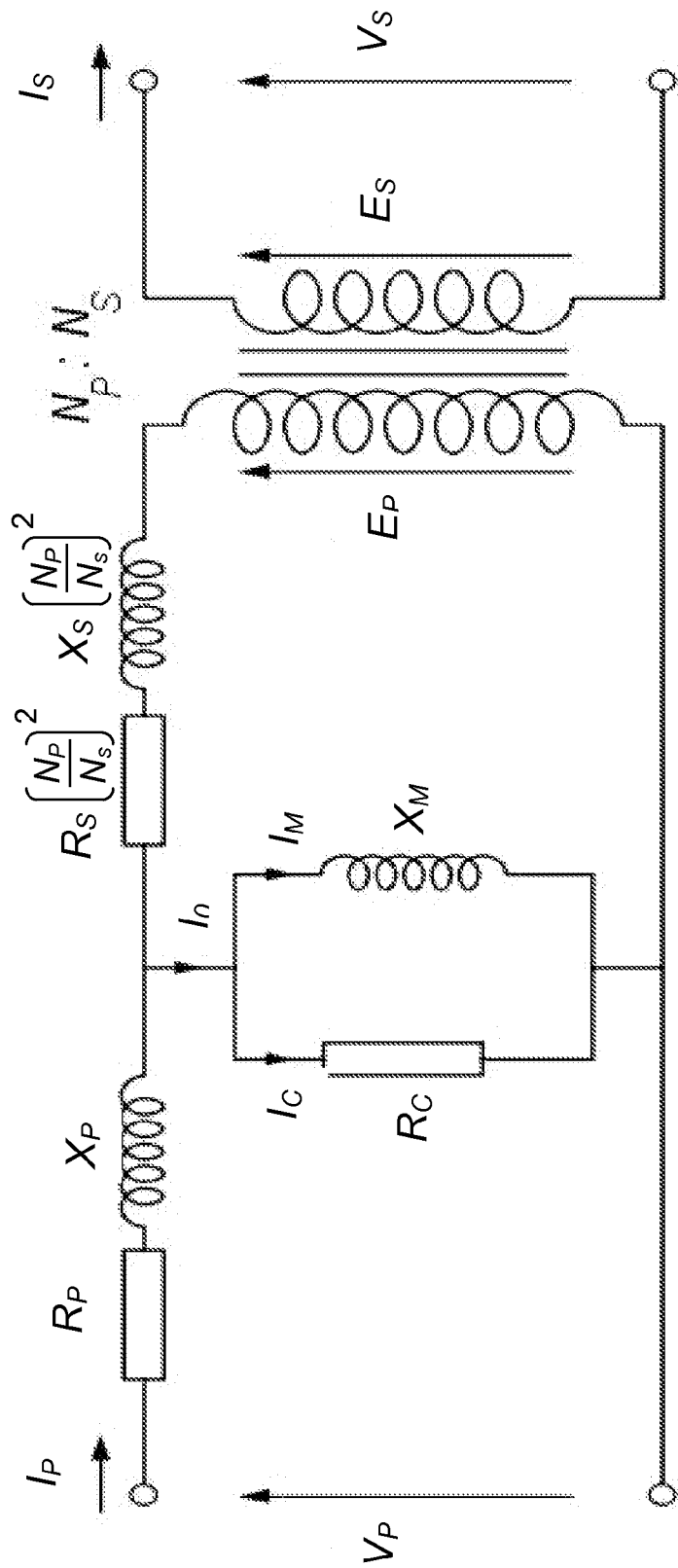
FIG. 8 is a circuit diagram for a transformer.

FIG. 8 is a circuit diagram of a transformer model. The transformer has $N_P$ turns in the primary winding, $N_S$ in the secondary. The reference characters shown in FIG. 8 may be defined as follows:
$R_P$=Primary winding resistance
$X_P$=Primary leakage reactance
$R_S$=Secondary winding resistance
$X_S$=Secondary leakage reactance
$R_C$=Core loss equivalent resistance
$X_M$=Magnetizing reactance
$V_P$=Primary winding voltage
$I_P$=Primary winding current
$V_S$=Secondary winding voltage
$I_S$=Secondary winding current
$E_P$=Electromotive force of the primary winding $E_S$=Electromotive force of the secondary winding
$I_C$=Current into $R_C$
$I_M$=Magnetizing current into $X_M$
$I_0$=No load current In the electrical model depicted in FIG. 8, the secondary winding resistance $R_S$ and the secondary leakage reactance $X_S$ have been reflected to the primary circuit by the turns ratio squared. For the MCCP antenna, the turns ratio is approximately unity (because both primary and secondary windings have about one turn of coil, i.e. $N_P$~$N_S$). When the current probe 12 encloses an open-ended structure 11, the magnetic energy couples into the structure 11; thus forming a half-turn coil pathway for the RF energy.

Figure 9A:
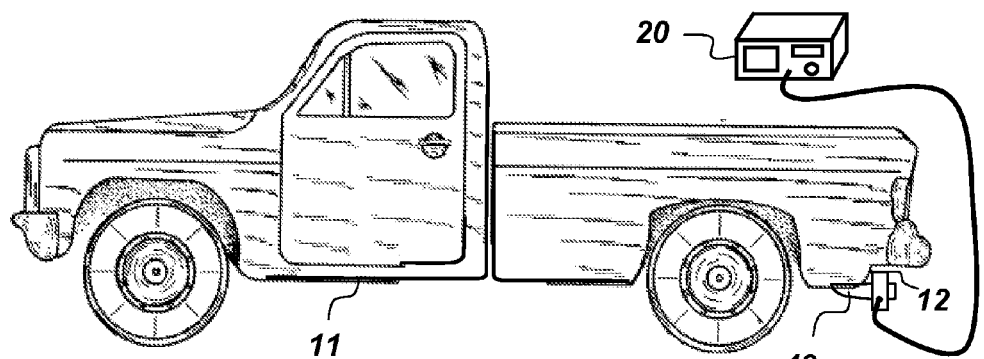
FIG. 9a is an illustration of a current probe mounted to a pickup truck.
Figure 9B:
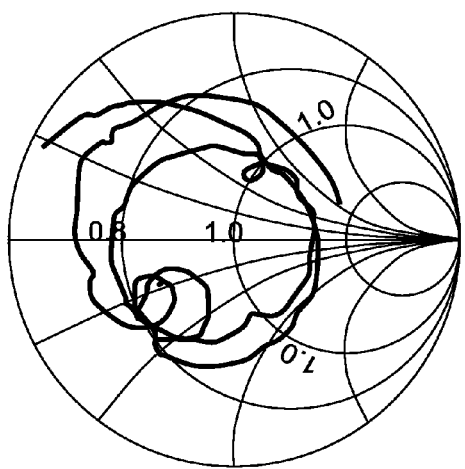
Figure 9C:
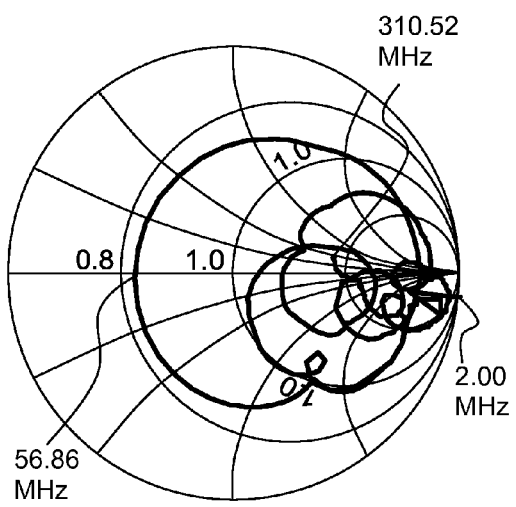
Figure 10A:
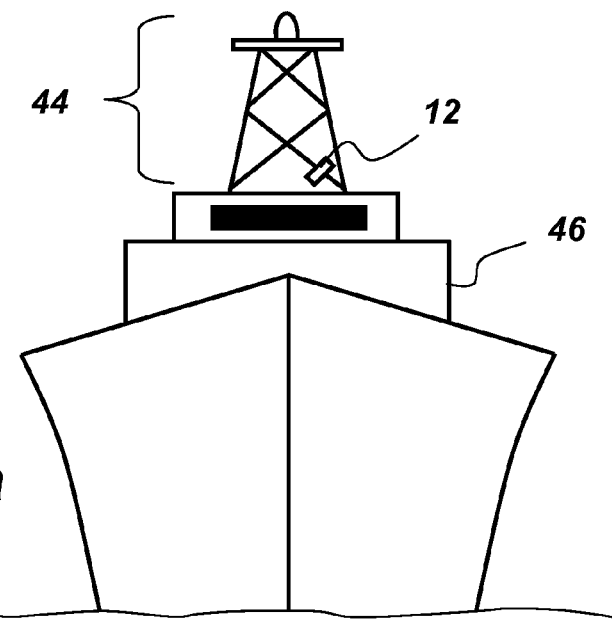
FIGS. 10a-10b are illustrations current probes mounted to different structures.
Figure 10B:
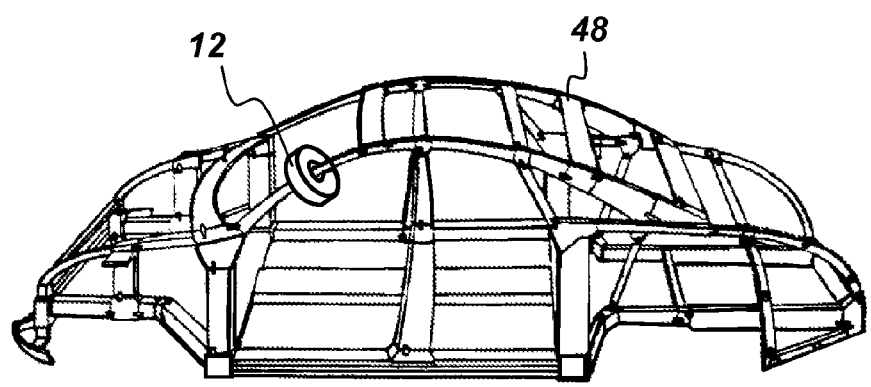

FIG. 9a shows another example embodiment of the structure 11. In this case, the structure 11 is a pickup truck and the current probe 12 is clamped around the tail pipe 42. The characteristic impedance at different locations on the pickup truck can be determined with method 10. FIG. 9b is a Smith Chart showing the resulting cascade impedance of the current probe 12 clamped around the tail pipe 42. FIG. 9c is a Smith Chart showing the resulting characteristic impedance of the tail pipe 42. FIGS. 10a and 10b show different example embodiments of the structure 11. In FIG. 10a, the current probe 12 is shown clamped to the superstructure 44 of a ship 46. In FIG. 10b, the current probe 12 is depicted as clamped to a vehicle chassis 48.

While the current probe 12 is in the open configuration, S-parameters of the current probe 12 may be measured by the VNA 20, and the open configuration impedance ($Z_{op}$) of the current probe 12 may be calculated. While the current probe 12 is in the short configuration, S-parameters of the current probe 12 may be measured by the VNA 20, and the short configuration impedance ($Z_{sh}$) of the current probe 12 may be calculated. While the current probe 12 is in the mounted configuration, S-parameters of the current probe 12 may be measured by the VNA 20, and the input impedance ($Z_{op}$) of the current probe 12 may be calculated.

From the above description of the impedance estimation method 10, it is manifest that various techniques may be used for implementing the concepts of method 10 without departing from its scope. The described embodiments are to be considered in all respects as illustrative and not restrictive. It should also be understood that method 10 is not limited to the particular embodiments described herein, but is capable of many embodiments without departing from the scope of the claims.

We claim:

1. A method for estimating a characteristic impedance of a structure comprising the following steps:
   providing a current probe comprising a magnetic core having an aperture therein and a primary winding wrapped around the core;
   measuring, with a calibrated vector network analyzer (VNA), an open impedance ($Z_{op}$) of the current probe while the current probe is in an open configuration wherein nothing but air occupies the aperture and the current probe is isolated from a ground;
   measuring, with the VNA, a short impedance ($Z_{sh}$) of the current probe while the current probe is in a short configuration, wherein the current probe is electrically shorted;
   measuring, with the VNA, an input impedance ($Z_{in}$) of the current probe while the current probe is mounted to the structure at a location A on the structure such that the structure extends through the aperture;
   calculating an estimated characteristic impedance ($Z'_{mast}$) of the structure at location A according to the following equation: $Z'_{mast}=(Z_{in}-Z_{sh})(Z_{op}-Z_{sh})/(Z_{op}-Z_{in})$; and
   clamping an impedance-matched current probe to the structure at location A to create a mast clamp current probe (MCCP) antenna.

2. The method of claim 1, wherein the structure comprises a grounded end and an open end.

3. The method of claim 1, wherein the structure is a closed-loop structure.

4. The method of claim 3, wherein the structure is a vehicle chassis.

5. The method of claim 3, wherein the structure is a ship superstructure.

6. The method of claim 1, wherein the current probe further comprises a conductive housing surrounding the core and the primary winding, and wherein the current probe is shorted by covering the walls of the aperture with conductive tape.

7. The method of claim 6, wherein the conductive tape is copper tape.

8. The method of claim 1, wherein the impedance-matched current probe is designed to match the characteristic impedance ($Z'_{mast}$) of the structure at location A.

9. The method of claim 1, wherein the current probe further comprises a conductive housing surrounding the core and the primary winding, and the current probe is shorted by wrapping a metallic wire around the conductive housing in a closed-loop configuration.

10. The method of claim 1, further comprising the steps of:
    measuring, with the VNA, a corresponding current probe input impedance ($Z_{in}$) for each of a plurality of current probe mounting locations on the structure;
    calculating an estimated characteristic impedance ($Z'_{mast}$) of the structure at each of the plurality of locations according to the equation: $Z'_{mast}=(Z_{in}-Z_{sh})(Z_{op}-Z_{sh})/(Z_{op}-Z_{in})$; and
    wherein, amongst a plurality of $Z'_{mast}$ values corresponding respectively to the plurality of locations, the $Z'_{mast}$ value corresponding to location A is the optimal impedance for radio frequency resonance of the MCCP antenna.

11. A method for estimating a characteristic impedance of a conductive structure comprising the following steps:
    providing a current probe comprising a magnetic core having an aperture therein, a primary winding wrapped around the core, and a conductive housing surrounding the core and the primary winding;
    measuring, with a calibrated vector network analyzer (VNA), the S-parameters of the current probe while the current probe is in an open configuration wherein nothing but air occupies the aperture and the current probe is isolated from ground, and calculating an open impedance ($Z_{op}$) of the current probe based on the measured open-configuration S-parameters;
    measuring, with the VNA, the S-parameters of the current probe while the current probe is in a short configuration, wherein the current probe is electrically shorted and calculating a short impedance ($Z_{sh}$) of the current probe based on the measured short-configuration S-parameters;
    measuring, with the VNA, the S-parameters of the current probe while the current probe is mounted to the structure at a given position such that the structure extends through the aperture and calculating an input impedance ($Z_{in}$) of the current probe based on the S-parameters which were measured while the current probe was mounted to the structure at the given position;

calculating an estimated structure characteristic impedance ($Z'_{mast}$) at the given position according to the following equation: $Z'_{mast}=(Z_{in}-Z_{sh})(Z_{op}-Z_{sh})/(Z_{op}-Z_{in})$; and clamping an impedance-matched current probe to the structure at the given location to create a mast clamp current probe (MCCP) antenna.

12. The method of claim 11, wherein the current probe is shorted by covering the walls of the aperture with copper tape.

13. The method of claim 11, wherein the current probe is shorted by clamping the current probe around a shorted measurement fixture.

14. The method of claim 11, wherein the current probe is shorted by wrapping a metallic wire around the conductive housing in a closed-loop configuration.

15. The method of claim 11, further comprising the step of determining a location on the structure having a substantially optimal impedance for MCCP radio frequency resonance by comparing calculated $Z'_{mast}$ values from multiple locations on the structure.

16. A method for estimating a characteristic impedance of a rigid, conductive structure for use as a mast clamp current probe antenna (MCCP) comprising the following steps:

a.) providing a toroidal current probe comprising an aperture;

b.) measuring, with a two-port vector network analyzer (VNA), the S-parameters of the current probe while the current probe is in an open configuration wherein nothing but air occupies the aperture and the current probe is electrically isolated from a ground, and calculating an open impedance ($Z_{op}$) of the current probe based on the measured open-configuration S-parameters;

c.) measuring, with the VNA, the S-parameters of the current probe while the current probe is in a short configuration, wherein the current probe is electrically shorted and calculating a short impedance ($Z_{sh}$) of the current probe based on the measured short-configuration S-parameters;

d.) measuring, with the VNA, the S-parameters of the current probe while the current probe is mounted to the structure at a given position such that the structure extends through the aperture and calculating an input impedance ($Z_{in}$) of the current probe based on the S-parameters which were measured while the current probe was mounted to the structure at the given position;

e.) calculating a characteristic impedance ($Z'_{mast}$) of the structure at the given location according to the following equation: $Z'_{mast}=(Z_{in}-Z_{sh})(Z_{op}-Z_{sh})/(Z_{op}-Z_{in})$;

f.) repeating steps (d) and (e) for each of a plurality of locations on the structure; and g.) identifying, amongst the plurality of locations, a best location having a corresponding $Z'_{mast}$ value that most closely matches the input impedance ($Z_{in}$) of the current probe.

17. The method of claim 16, further comprising the step of creating an MCCP antenna by mounting the current probe to the structure at the best location such that the structure supports the current probe and such that energy fed into the current probe is magnetically coupled to the structure and that the structure, in turn, radiates the energy into space.

* * * * *